(12) United States Patent
Liu et al.

(10) Patent No.: US 7,389,930 B2
(45) Date of Patent: Jun. 24, 2008

(54) MASK MANAGEMENT METHOD AND BAR CODE READING APPARATUS THEREOF

(75) Inventors: Kuo-Chung Liu, Hsinchu (TW); Wen-Jui Tseng, Taichung (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 428 days.

(21) Appl. No.: 11/148,382

(22) Filed: Jun. 9, 2005

(65) Prior Publication Data

US 2006/0022049 A1 Feb. 2, 2006

(30) Foreign Application Priority Data

Aug. 2, 2004 (TW) .............................. 93123073 A

(51) Int. Cl.
*G06K 7/10* (2006.01)

(52) U.S. Cl. .................... 235/462.14; 430/5; 430/396

(58) Field of Classification Search ............ 235/462.14, 235/462.01, 462.09; 430/5, 396; 438/551
See application file for complete search history.

(56) References Cited

U.S. PATENT DOCUMENTS

| | | | |
|---|---|---|---|
| 6,190,807 B1 * | 2/2001 | Wang et al. ..................... 430/5 |
| 6,503,670 B1 * | 1/2003 | Kuran .......................... 430/22 |
| 6,507,029 B1 * | 1/2003 | Nishimura et al. ...... 250/442.11 |
| 6,703,328 B2 * | 3/2004 | Tanaka et al. ................ 438/462 |
| 6,710,847 B1 * | 3/2004 | Irie .............................. 355/53 |
| 6,888,621 B2 * | 5/2005 | Araki et al. .................... 355/75 |
| 2003/0059685 A1 * | 3/2003 | Ohsaka .......................... 430/5 |
| 2006/0269851 A1 * | 11/2006 | Frisa et al. ..................... 430/5 |

FOREIGN PATENT DOCUMENTS

TW 430117 4/2001

* cited by examiner

*Primary Examiner*—Ahshik Kim
(74) *Attorney, Agent, or Firm*—Muncy, Geissler, Olds & Lowe, PLLC

(57) ABSTRACT

A mask management and bar code reading apparatus thereof are disclosed. The mask management method comprises providing a bar code reading apparatus, scanning a mask bar code on the mask by the bar code reading apparatus, transferring scanned information to a mask management system, producing a box bar code, moving the mask to a mask pod from a mask protective case, sticking the box bar code on the mask pod, inputting the data recorded in the box bar code into an exposure equipment, and exposing the mask by the exposure equipment. The bar code reading apparatus includes at least a clamping element to clamp the mask protective case, at least a reading head disposed on the clamping element to read a mask bar code, and a first light source providing a first light to irradiate the mask protective case to increase reading accuracy of the reading head.

21 Claims, 9 Drawing Sheets

MASK MANAGEMENT METHOD AND BAR CODE READING APPARATUS THEREOF

BACKGROUND

The invention relates to a mask management method and bar code reading apparatus thereof, and in particular to a bar code reading apparatus for managing mask bar codes.

FIG. 1 is flowchart of a conventional mask management method. A mask and a mask protective case are provided (step S11). The mask is contained in the mask protective case. As shown in FIGS. 3a and 3b, the mask 100 in the mask protective case 200 has mask bar codes 110 and 120 thereon. The mask protective case 200 is a transparent box with red, blue or colorless colors according to different brands, materials, and transmittance. The conventional mask management method requires a list of mask bar codes provided by suppliers. Then box bar codes are printed (step S12) according to the list. An exposure equipment requires to use a standard-sized mask pod for automatic exposure process. In a clean room, a mask 100 is taken out of the mask protective case 200 and disposed into a mask pod (step S13). And then, a box bar code is stick on the mask pod (step S14) to indicate different mask information thereon. During exposure, the mask pod is disposed in an exposure equipment (step S15), and the exposure equipment automatically scans the box bar code and inputs the scanned information step S16. And then the exposure equipment utilizes the mask for exposure process (step S17).

Another mask management method is shown in FIG. 2, in which a step of sticking the box bar code on the mask pod is omitted. After a supplier provides a mask and a mask protective case (step S21), the mask protective case is changed to a mask pod (step S22) such that the mask is moved from the mask protective case to the mask pod. The mask pod and the mask therein are disposed in the exposure equipment (step S23). After automatic scanning the mask bar code and inputting scanned information (step S24), the exposure equipment starts exposure process (step S25).

According to the mask management method in FIG. 1, since the box bar code is produced from a list of information from suppliers, mistakes due to human-errors sometimes occur. For example, the list of mask information from the supplier does not correspond to the masks in the mask protective case. In addition, during box bar code manufacturing process, mistakes can cause inconformity between the box bar codes and the mask bar codes. Moreover, the mask management mask in FIG. 2 omits the step of sticking the box bar does. It is difficult for mask management since some masks could be mistakenly put in the mask protective case during mask moving process. Also, during exposing process, subsequent procedure management can be interrupted and equipment could be crashed because of using wrong masks, wasting lots of money and time.

Furthermore, most of current exposure equipment only reads one-dimensional bar codes. Thus, if the bar code is two-dimensional, the exposure equipment cannot recognize two-dimensional bar codes, and unable to input the masks, interfering production process. In addition, if the step of matching the box bar codes with the mask bar codes is omitted, serious manufacturing and material losses can be resulted because of using a wrong mask.

Thus, the conventional mask management methods still cost significantly with limited bar code reading ability, as yet the conventional method still cannot accurately provide correct mask for exposure process.

SUMMARY

Embodiments of the invention provide a mask management method and a bar code apparatus thereof that eliminate the shortcomings described above.

Further provided is a mask management method comprising the steps of providing a bar code reading apparatus, scanning a mask bar code on the mask in a mask protective case by the bar code reading apparatus, producing a box bar code according to scanned information, and putting the mask in a mask pod and sticking the box bar code on the mask pod.

The bar code reading apparatus includes at least a clamping element to clamp the mask protective case, at least a reading head disposed on the clamping element to read a mask bar code, and a first light source providing a first light to irradiate the mask protective case to increase reading accuracy of the reading head.

According to the mask management method by the bar code reading apparatus of the invention, it is unnecessary to use list of the mask bar codes from the supplier. By directly scanning the mask bar codes in the mask protective case, the box bar codes can be produced and stick on the mask pod. Thus, problem of inconformity between the box bar codes and the masks therein due to human errors can be prevented. Chances of wrongly inputting the masks into exposure equipment are reduced. Moreover, the bar code reading apparatus can recognize both one-dimensional and two-dimensional bar codes.

BRIEF DESCRIPTION OF THE DRAWINGS

Embodiments of the invention can be more fully understood by reading the subsequent detailed description in conjunction with the examples and references made to the accompanying drawings, wherein.

DETAILED DESCRIPTION

Figure 1:
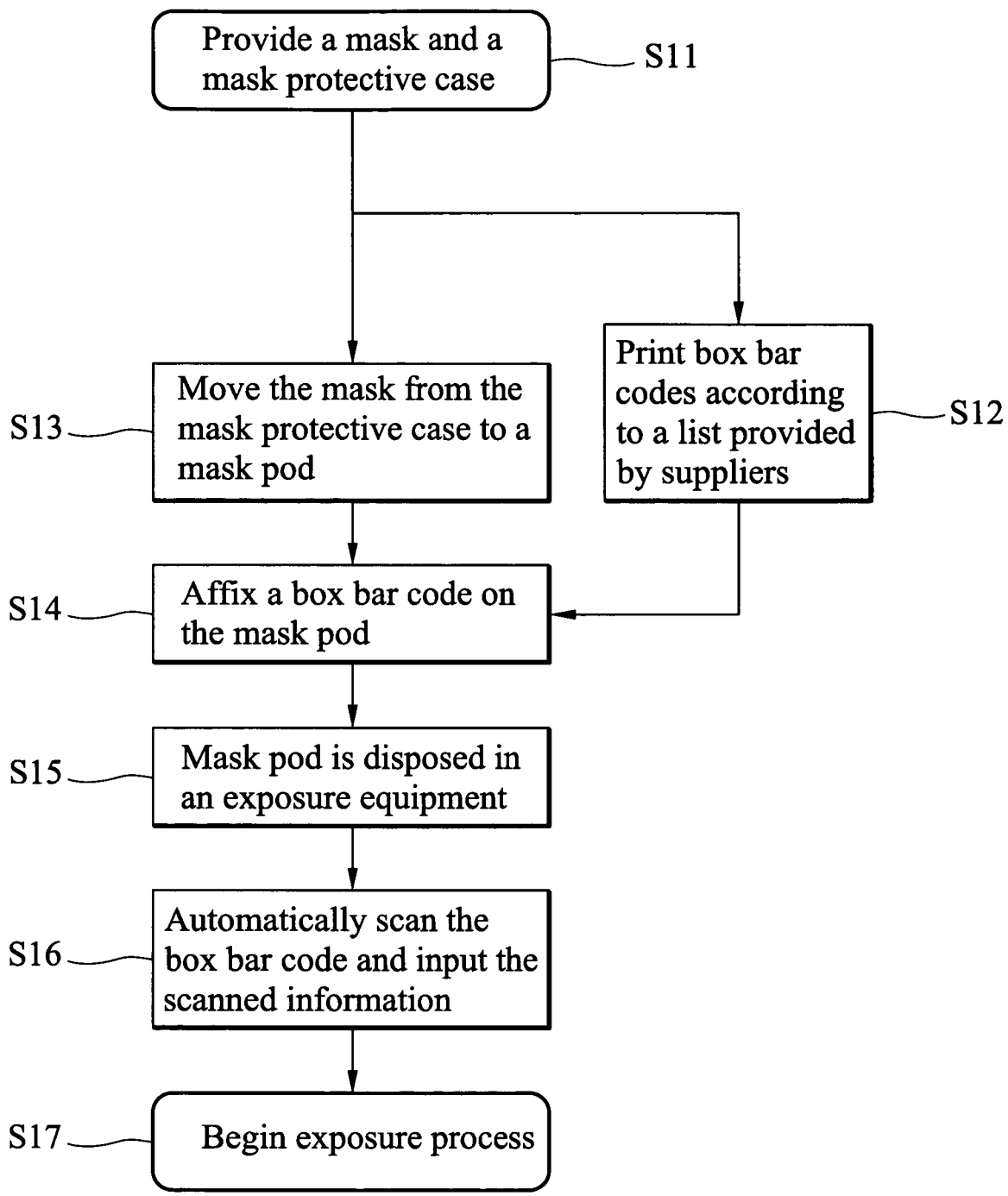
FIGS. 1 and 2 are flowcharts of conventional mask management methods.
Figure 2:
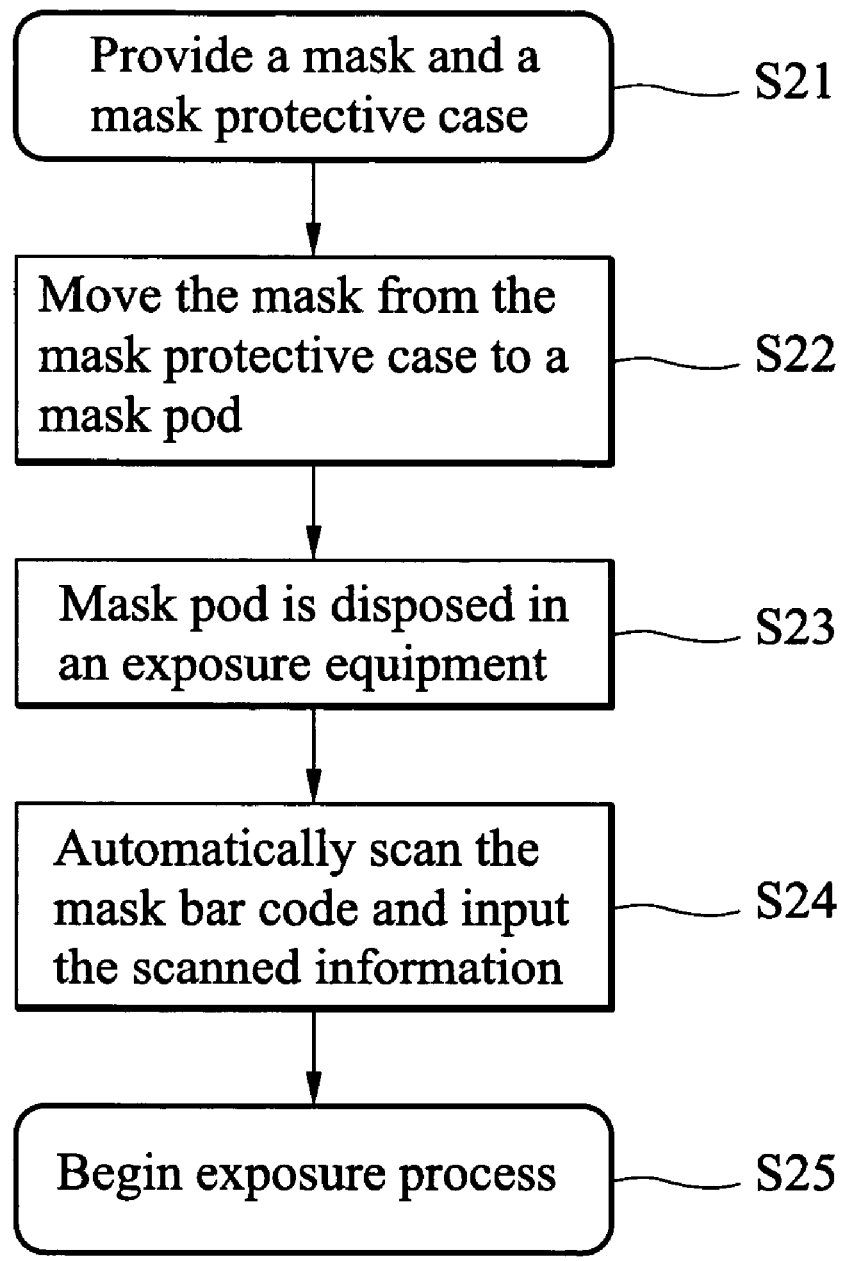
Figure 3A:
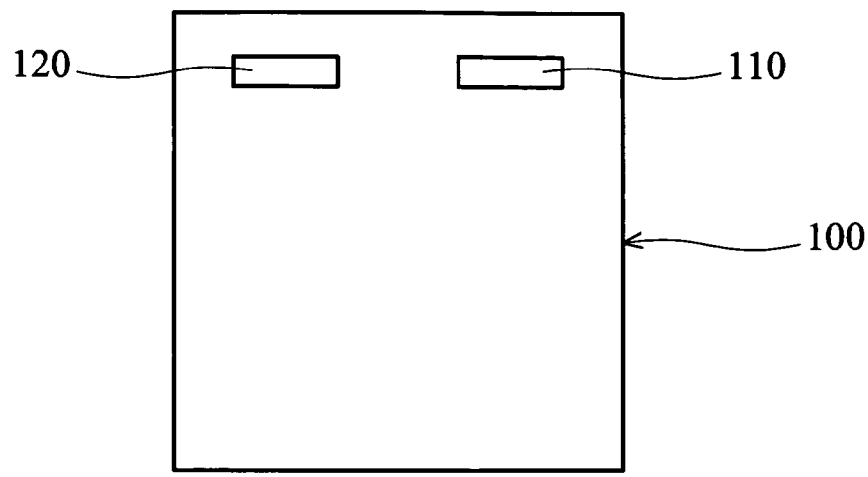
FIG. 3a is a top view of a conventional mask.
Figure 3B:
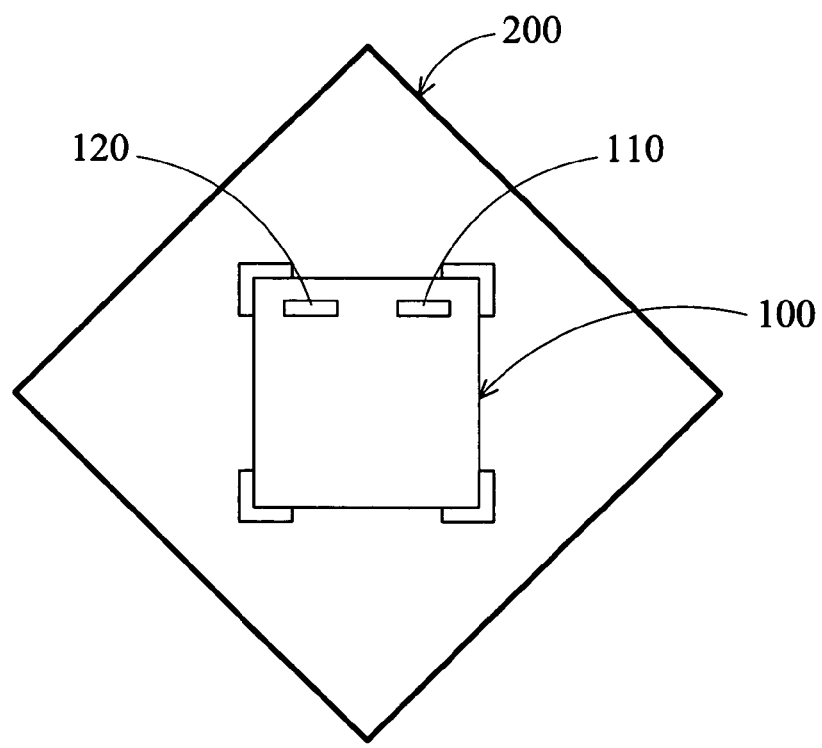
FIG. 3b is a top view of a conventional mask contained in a mask protective case.
Figure 4:
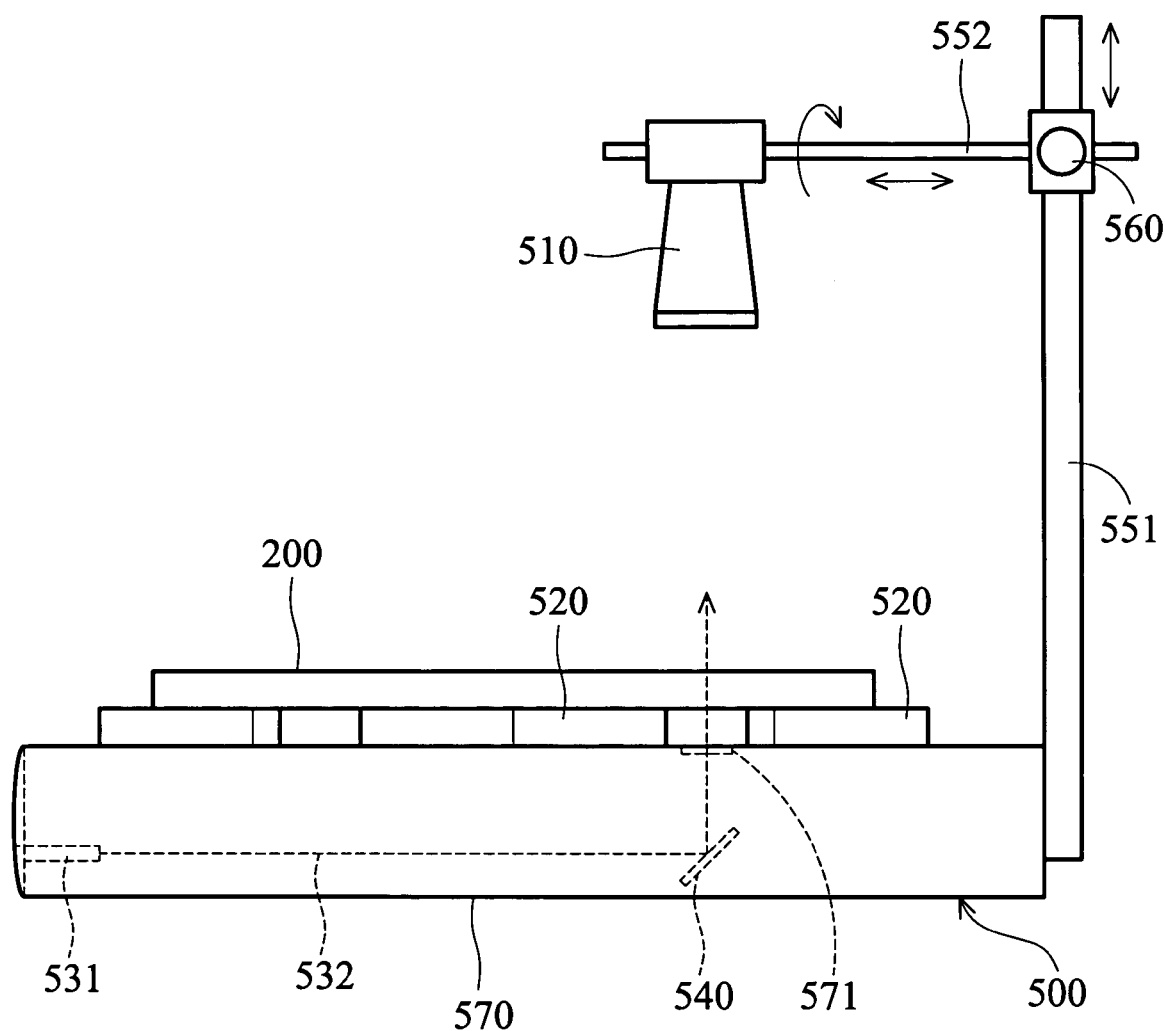
FIG. 4 is a side view of a bar code reading apparatus of an embodiment of the invention.

FIG. 4 is a side view of a bar code reading apparatus 500 of an embodiment of the invention. The bar code reading apparatus 500 comprises a reading head 510, a clamping element 520, a first light source 531, a reflective mirror 540, a first rod 551, a second rod 552, a connecting head 560, and a base 570. The first light source 531 and a reflective mirror 540 are disposed in the base 570. The clamping element 520 is disposed on the base 570. The connecting head 560 is connected to the first rod 551 and the second rod 552, and the first rod 551 is fixed on the second rod for auxiliary lighting. The reading head 510 is disposed on the second rod 552. When the mask protective case 200 is disposed on the base 570, the reading head 510 can read the mask bar code 110 and 120 on the masks 100 in the mask protective case 200, as shown in FIG. 3b. When the bar code reading apparatus 500 reads the mask bar codes 110 and 120, the first light source 531 emits a first light 532, reflected by the reflective mirror 540, passing through a transparent portion 571, and projected at the mask bar codes 110 and 120. Thus, the reading head 510 can easily read the information recorded in the mask bar codes 110 and 120 via the first light 532. The first light source 531 provides light to the mask protective case 200 from bottom to top. Note that in the invention, the light is guided by the reflective mirror 540 as an example, and the invention is not limited thereto.

Figure 5:
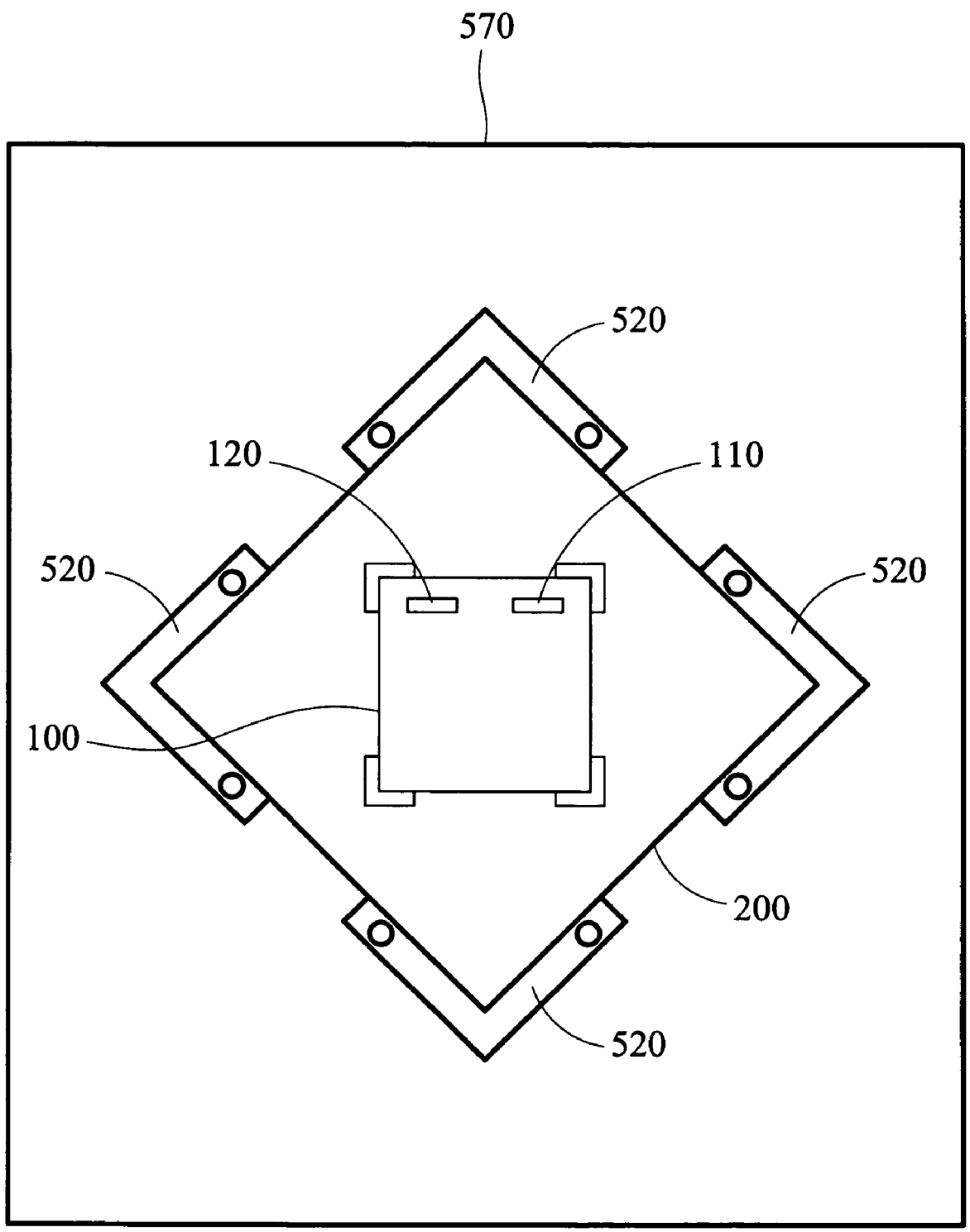
FIG. 5 is a top view of a bar code reading apparatus disposed on a mask protective case.

As shown in FIG. 5, the mask protective case 200 is disposed on the base 570. The mask protective case 200 is clamped by the clamping element 520, shaped as a L-shaped corresponding to the shape of the rectangular mask protective case 200 for positioning. Thus, the information in the mask bar codes 110 and 120 on the mask 100 in the mask protective case 200 can be easily read by the reading head 510.

Figure 6:
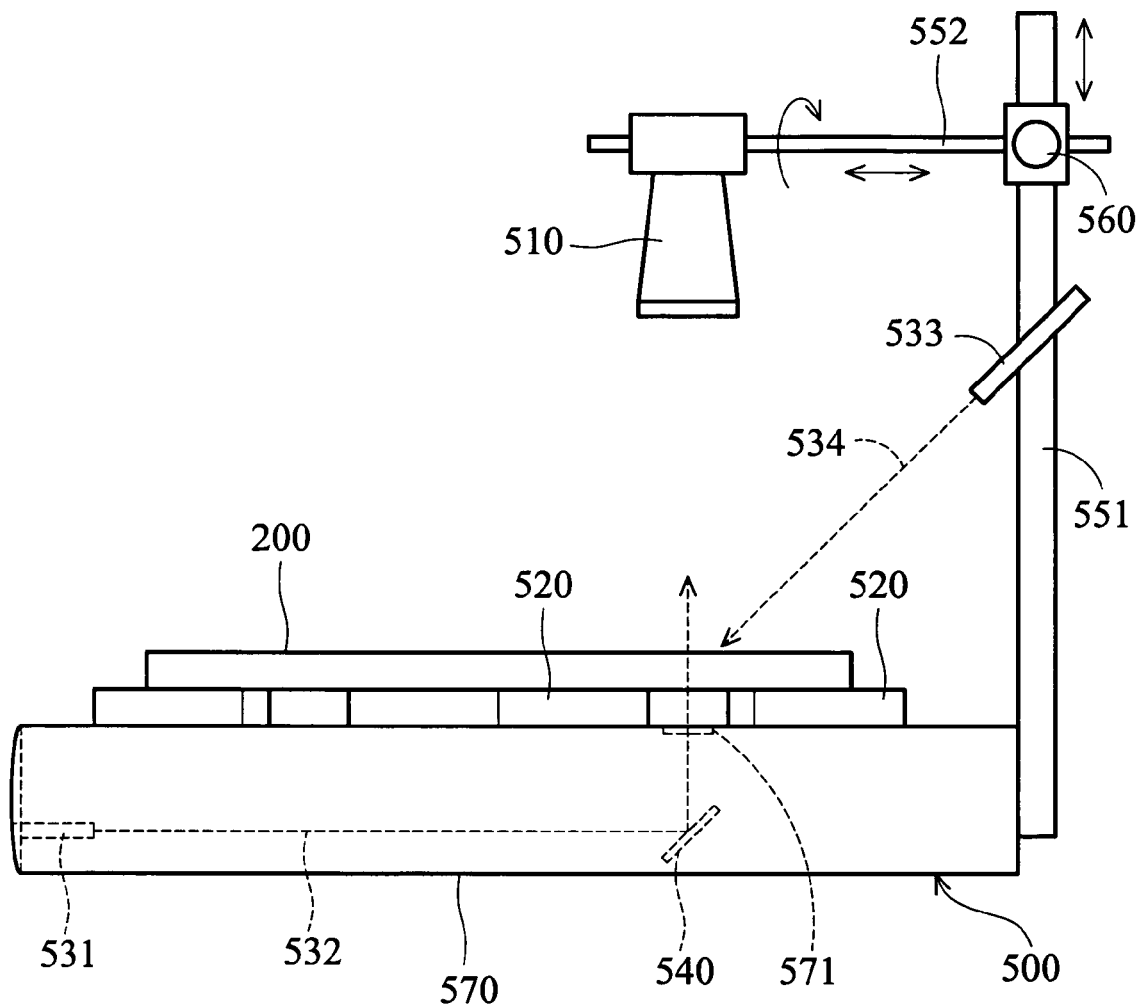
FIG. 6 is a side view of a bar code reading apparatus of another embodiment of the invention.

In addition, as shown in FIG. 6, the bar code reading apparatus 500 further comprises a second light source 533, disposed on the first rod 551. The second light source 533 emits a second light 534 irradiating the mask bar codes 110 and 120, increasing reading accuracy of the reading head 510.

The first light source 531 and the second light source 533 comprise light emitting diodes, in this embodiment. For example, when the mask protective case 200 is red, the first light 532 and the second light 534 are preferably red light. When the mask protective case 200 is blue, the first light 532 and the second light 534 are preferably blue light. When the mask protective case 200 is transparent, the first light 532 and the second light 534 are preferably white light. The invention is not limited thereto. The light source is selected according to material, transmittance, colors of the mask protective case 200 such that the reading ability of the reading head 510 is increased.

The reading head 510 is slidably disposed on the first rod 551 via the connecting head 560 and adjusts focus in a direction perpendicular to the mask bar codes. The reading head 510 is slidably disposed on the second rod 552 and moves in a direction parallel to the surface of the mask bar code for appropriate reading position. The reading head 510 can also rotates around the second rod 552 for different reading positions.

The reading head 510 can read one-dimensional or even two-dimensional bar codes. For example, a reading head produced by TOHKEN company is a preferable choice.

Figure 7A:
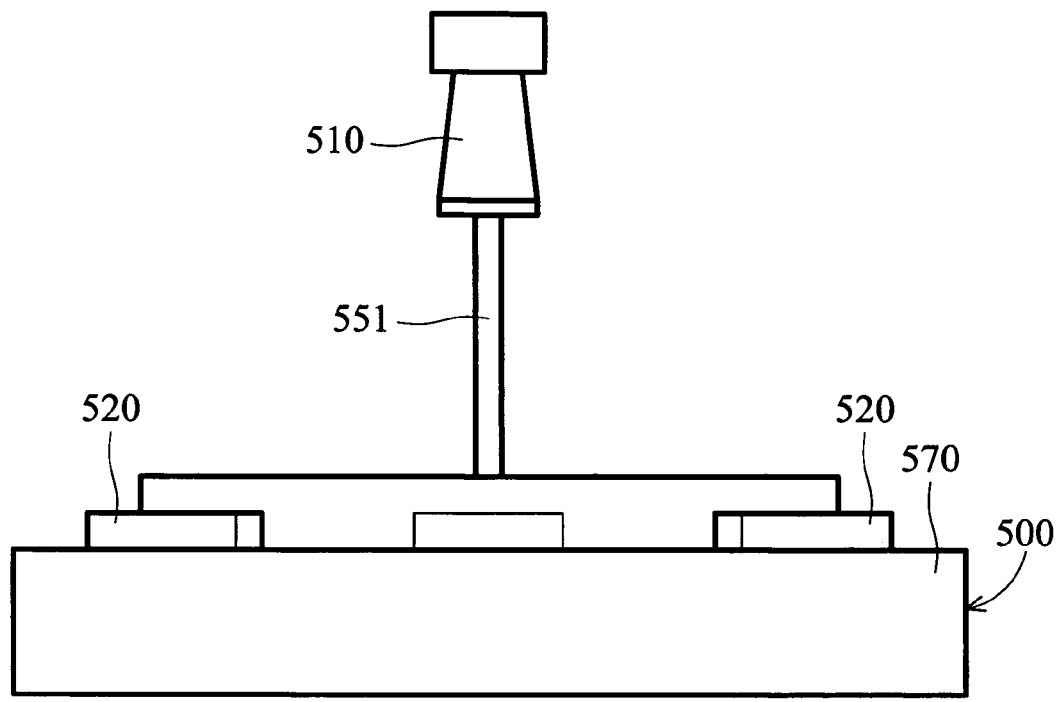
FIG. 7a is a front side view of a bar code reading apparatus.
Figure 7B:
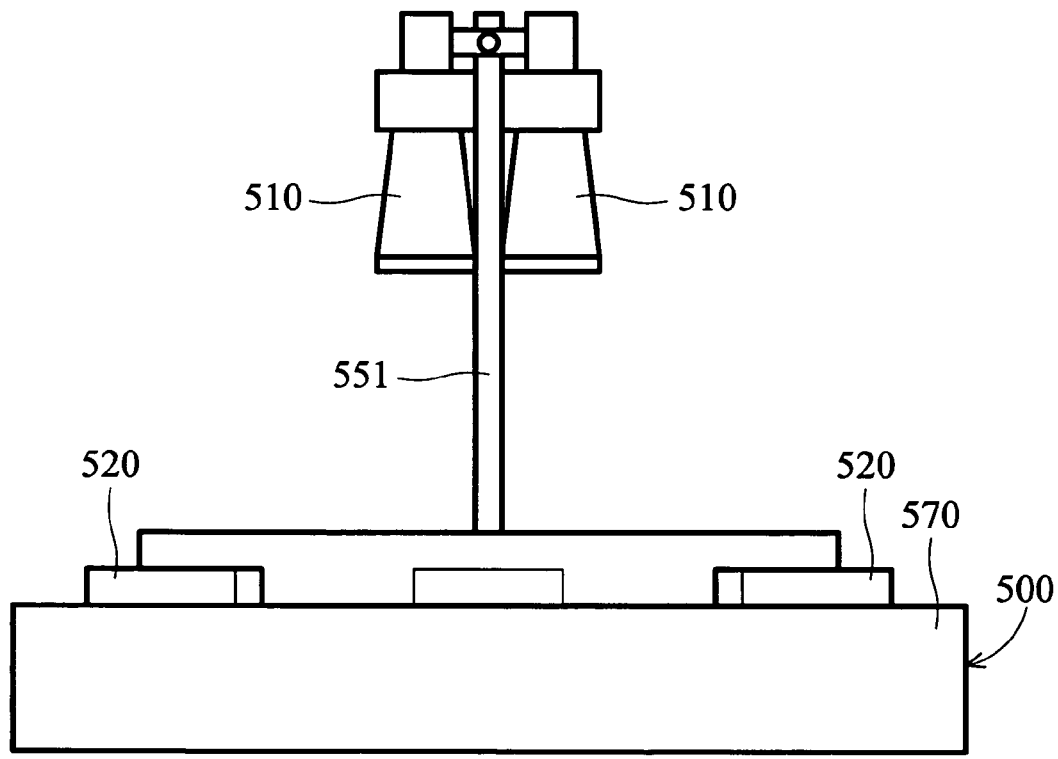
FIG. 7b is a front side view of another bar code reading apparatus.

As shown in FIG. 7a, the reading head 510 is a single head. The relative position between the base 570 and the reading head 510 is adjusted to read the mask bar codes. In another embodiment, as shown in FIG. 7b, two reading heads 510 can be utilized to directly read mask bar codes from different positions. In conclusion, the bar code reading apparatus 500 of the invention can read the mask bar codes 110 and 120 on the mask 100 for producing corresponding box bar codes.

Figure 8:
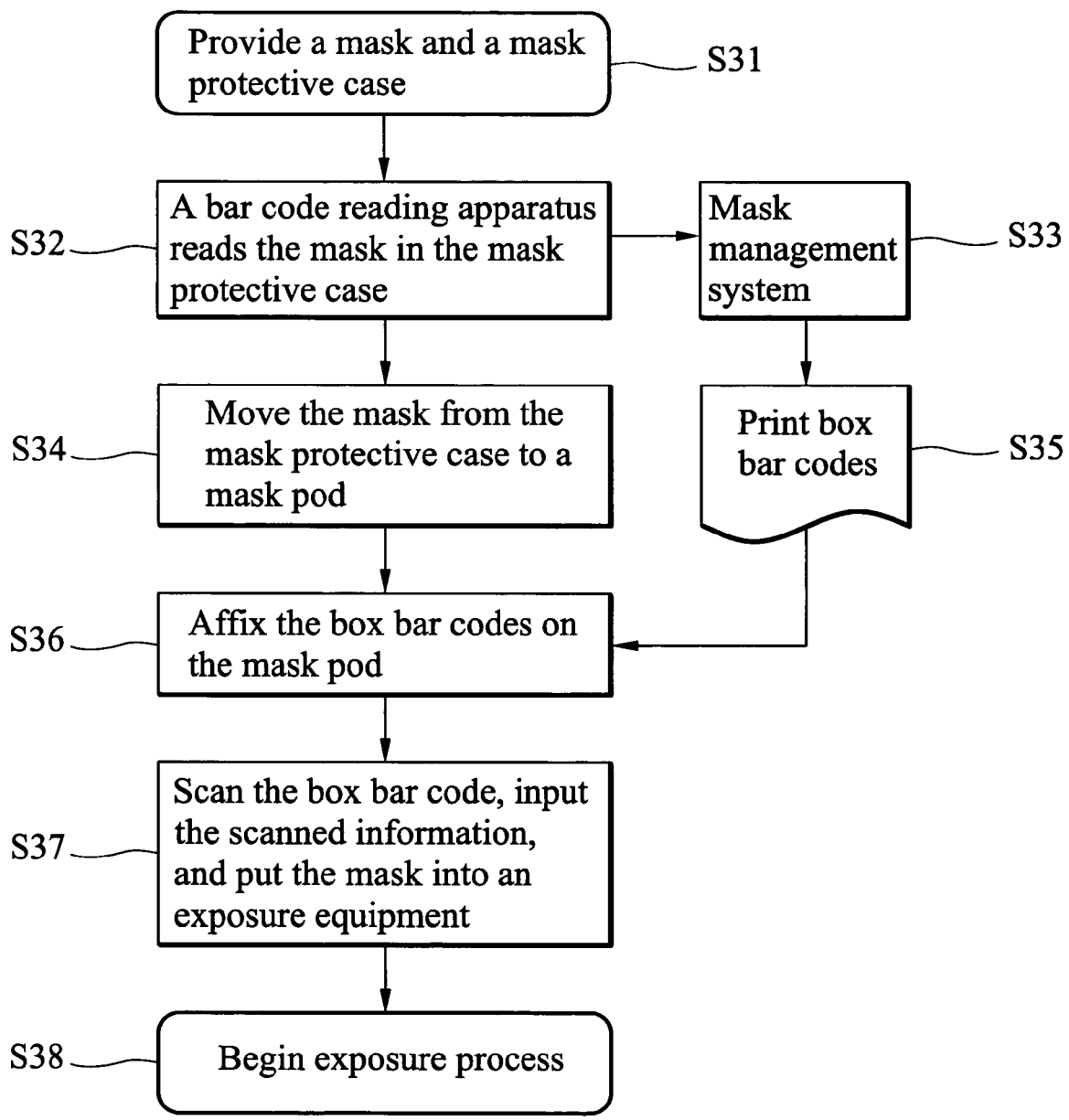
FIG. 8 is a flowchart of a mask management method of the invention.

FIG. 8 is a flowchart of a mask management method of the invention. As shown in FIG. 8, the supplier provides new masks and a mask protective case (step S31). Then the bar code reading apparatus 500 as described above is provided to read the masks in the mask protective case (step S32). The scanned information from the mask bar codes is automatically transferred to a mask management system (step S33) and box bar codes are produced (step S35). The mask 100 is obtained from the mask protective case and moved to a mask pod (step S34). The box bar codes are stick on the mask pod (step S36). Operators can manually scan the box bar codes or the box bar codes are automatically read by an exposure equipment (step S37) after the mask pod is put therein. The mask information is recorded such that the exposure equipment can start exposure process according to the mask (step S38).

The mask bar codes 110 and 120 can be standard bar codes from mask manufacturers with corresponding information such as brand names, specifications, and manufacturing numbers.

Figure 9:
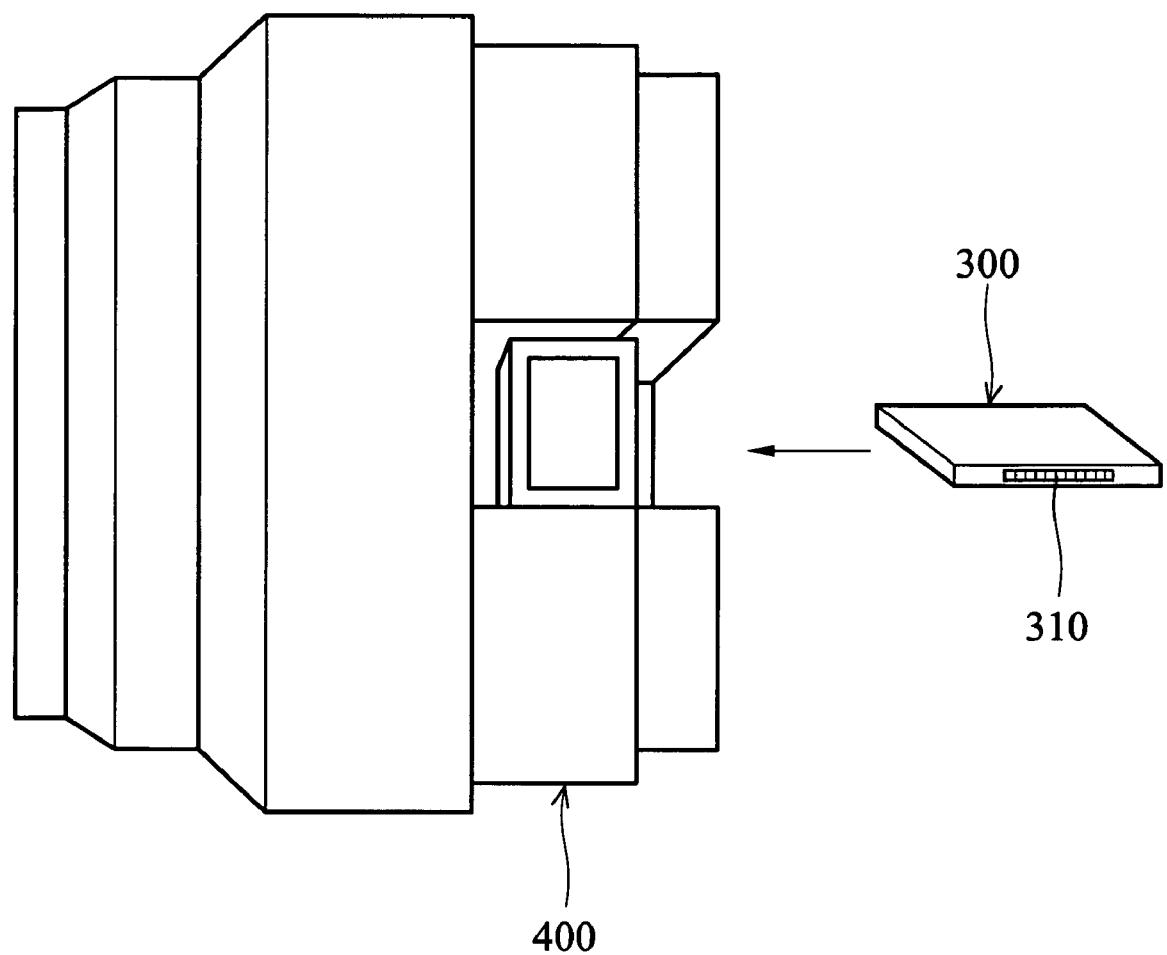
FIG. 9 is a schematic view of a mask pod and an exposure equipment.

FIG. 9 is a schematic view of a mask pod and an exposure equipment. As shown in FIGS. 8 and 9, in a clean room, the mask is moved from the mask protective case 200 to the mask pod 300 (step S34). The previously produced box bar codes 310 are disposed on the mask pod 300 (step S36). During exposure, the box bar codes 310 are manually scanned, or after the mask pod 300 is put in the exposure equipment for automatic scanning the mask information (step S37) such that the exposure equipment 400 can start exposure process according to the mask (step S38).

Hence, after obtaining the mask 100, box bar codes 300, produced according to the mask bar codes 110 and 120 on the mask 100, are put on the mask pod 300. The problem of inconformity between the box bar code 310 and the mask 100 therein can be avoided. It can be ensure that correct mask is used during exposure process. Moreover, the bar code reading apparatus of the invention can read both one-dimensional and two-dimensional bar codes such that different types of bar codes are readable, and thus, reading capability of the exposure equipment can be increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bar code reading apparatus, reading a mask bar code on a mask in a mask protective case, comprising:
   at least a clamping element, clamping the mask protective case;
   at least a reading head disposed corresponding to the mask protective case and reading a mask bar code;
   a base, supporting the mask protective case;
   a first rod connected to the base;
   a second rod connecting the reading head and the first rod; and
   a first light source, disposed in the base, providing a first light to irradiate the mask protective case.

2. The bar code reading apparatus as claimed in claim 1, wherein the first light emitted by the first light source irradiates the mask protective case from bottom to top.

3. The bar code reading apparatus as claimed in claim 1, further comprising a second light source, emitting a second light irradiating the mask protective case from top to bottom.

4. The bar code reading apparatus as claimed in claim 1, wherein the first light source modulates colors of the first light with respect to different materials, transmittance, colors of the mask protective case.

5. The bar code reading apparatus as claimed in claim 1, wherein the first light source comprises light emitting diode.

6. The bar code reading apparatus as claimed in claim 1, wherein the reading head moves in a direction parallel to a surface of the mask bar code, modifying an adequate reading position.

7. The bar code reading apparatus as claimed in claim 1, wherein the reading head moves in a direction perpendicular to a surface of the mask bar code, modifying focal length thereof.

8. The bar code reading apparatus as claimed in claim 1, wherein the reading head rotates in a direction parallel to a surface of the mask bar code for different reading positions.

9. The bar code reading apparatus as claimed in claim 1 further comprising a reflective mirror, disposed in the base, reflecting the first light to the mask bar code.

10. The bar code reading apparatus as claimed in claim 1, wherein the reading head reads linear bar codes and two-dimensional bar codes.

11. A mask management method, comprising:
providing a bar code reading apparatus;
scanning a mask bar code on the mask in a mask protective case by the bar code reading apparatus;
producing a box bar code according to scanned information from the bar code reading apparatus;
moving the mask to a mask pod; and
sticking the box bar code on the mask pod.

12. The mask management method as claimed in claim 11, wherein the bar code reading apparatus increases reading accuracy by a first light emitted by a first light source, irradiating at the mask protective case.

13. The mask management method as claimed in claim 12, wherein when the mask protective case is red, the first light comprises red light.

14. The mask management method as claimed in claim 12, wherein when the mask protective case is blue, the first light comprises blue light.

15. The mask management method as claimed in claim 12, wherein when the mask protective case is colorless, the first light comprises white light.

16. The mask management method as claimed in claim 11, further comprising transferring the scanned information from the bar code reading apparatus into a mask management system, and automatically printing the box bar code.

17. A bar code reading apparatus, comprising:
a base, supporting a mask protective case;
a clamping element, disposed on the base to position the mask protective case;
a first rod, comprising an end connected to the base;
a second rod, comprising an end connected to the other end of the first rod;
a reading head, disposed above the base and connected to the other end of the second rod to read a mask bar code on the mask protective case from top to bottom; and
a first light source, disposed in the base to provide a first light irradiating from the bottom of the mask protective case to top.

18. The bar code apparatus as claimed in claim 17, further comprising a connecting head, connecting the first rod and the second rod.

19. The bar code apparatus as claimed in claim 17, further comprising a second light source, emitting a second light irradiating the mask protective case from top to bottom to increase reading ability.

20. The bar code apparatus as claimed in claim 17, wherein the first light source is disposed on a side of the base, and the bar code apparatus further comprises a reflective mirror disposed in the base reflecting the first light to the mask bar code.

21. The bar code apparatus as claimed in claim 17, wherein the clamping element is disposed on the base with an L-shape corresponding to the shape of the mask protective case.

* * * * *